United States Patent [19]

Zarreii

[11] Patent Number: 5,158,470

[45] Date of Patent: Oct. 27, 1992

[54] SOLDERLESS SYSTEM FOR RETENTION AND CONNECTION OF A CONTACT WITH A PLASTIC CIRCUIT ELEMENT

[75] Inventor: Mansour Zarreii, Mechanicsburg, Pa.

[73] Assignee: AMP Incorporated, Harrisburg, Pa.

[21] Appl. No.: 704,552

[22] Filed: May 23, 1991

[51] Int. Cl.⁵ .................................. H01R 23/70
[52] U.S. Cl. ................................ 439/79; 439/620; 439/751; 439/931
[58] Field of Search ............... 439/79, 80, 65, 931, 439/620, 733, 751, 869, 873

[56] References Cited

U.S. PATENT DOCUMENTS

| | | | |
|---|---|---|---|
| 3,440,597 | 4/1969 | Baker, II et al. | 339/221 |
| 3,444,504 | 5/1969 | Lynch et al. | 339/64 |
| 3,629,185 | 12/1971 | Schneble, Jr. et al. | 260/40 R |
| 3,745,045 | 7/1973 | Brenneman et al. | 117/212 |
| 3,985,413 | 10/1976 | Evans | 339/17 LM |
| 4,077,694 | 3/1978 | Cobaugh et al. | 339/176 MP |
| 4,186,982 | 2/1980 | Cobaugh et al. | 339/17 C |
| 4,274,700 | 6/1981 | Keglewitsch | 439/751 |
| 4,464,007 | 8/1984 | Parmer | 339/220 T |
| 4,511,597 | 4/1985 | Teng et al. | 427/53.1 |
| 4,532,152 | 7/1985 | Elarde | 427/96 |
| 4,583,807 | 4/1986 | Kaufman et al. | 339/125 R |
| 4,588,456 | 5/1986 | Dery et al. | 156/52 |
| 4,604,799 | 8/1986 | Gurol | 29/897 |
| 4,676,565 | 6/1987 | Reichardt | 439/79 |
| 4,729,809 | 3/1988 | Dery et al. | 156/306.6 |
| 4,872,844 | 10/1989 | Grebe et al. | 439/69 |
| 5,030,113 | 7/1991 | Wilson | 439/931 |

OTHER PUBLICATIONS

AMP Catalog No. 85-774, "Ampliflex Surface-To-Surface Resilient Connectors", Dec., 1985; AMP Incorporated, Harrisburg, Pa.

*Primary Examiner*—Neil Abrams
*Attorney, Agent, or Firm*—Anton P. Ness

[57] ABSTRACT

A molded plastic circuit element such as connector (50) includes a housing (52) molded of plastic to be nonresilient and have a plurality of cavities (68) into which are inserted compliant spring portions (44) of compliant pin contacts (42), for self-retention therein by strong interference fit. The side walls of the cavities (68) are plated to a substantial thickness (70) of copper or the like equivalent to about one ounce. An assured electrical connection is formed by the compliant pin (42) with the plating material (70) without solder, the plating material remaining assuredly integral to define a gastight connection over long-term in-service use. The contacts (42) of the array can enable mating with a corresponding connector (18) while circuit paths (74) extend from the plated cavities (68) to another array of pads (90) to connect to a circuit element (20) and interconnect it with connector (18). Such a connector (110) can have two arrays of such pins in such cavities, to interconnect two circuit boards (12,20) with plated circuit paths (144) connecting associated cavities of the arrays.

25 Claims, 13 Drawing Sheets

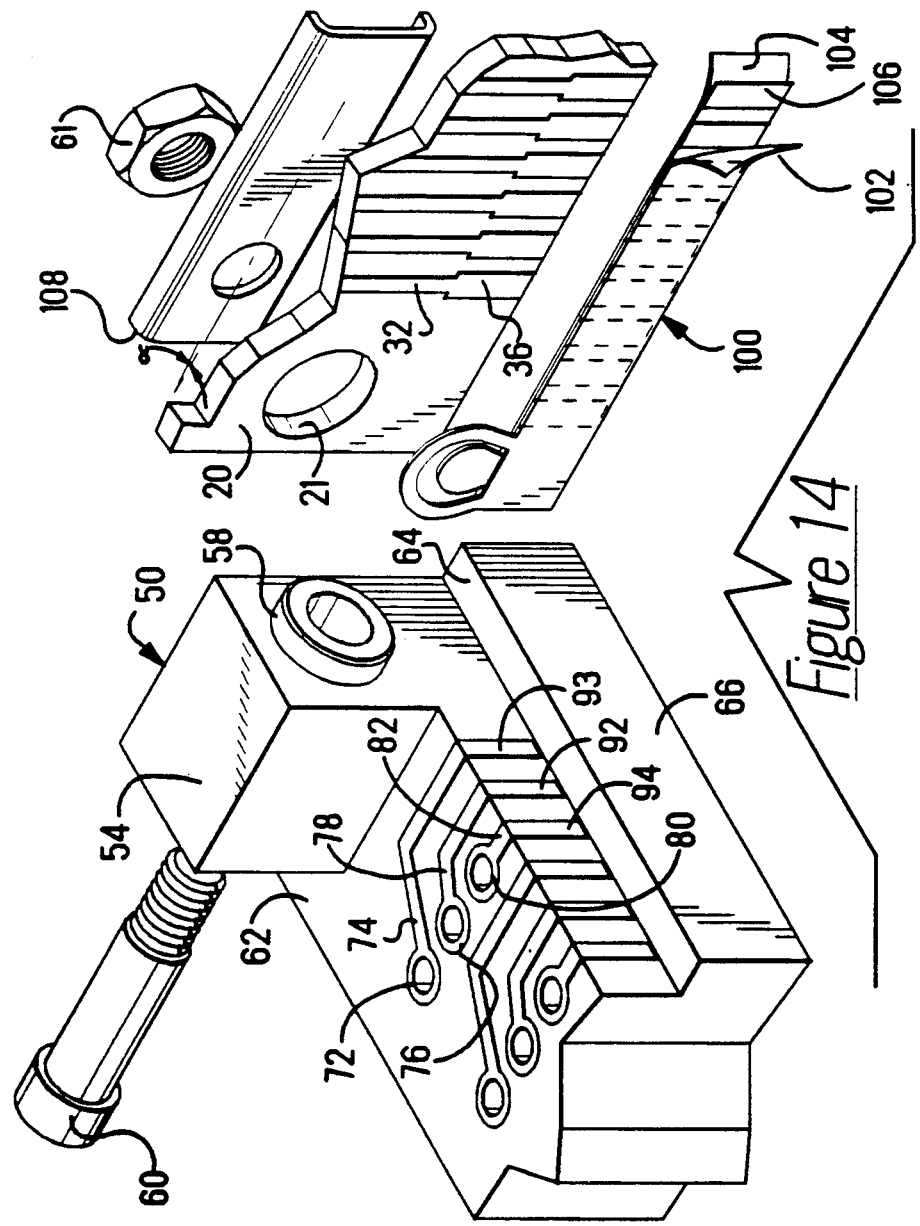

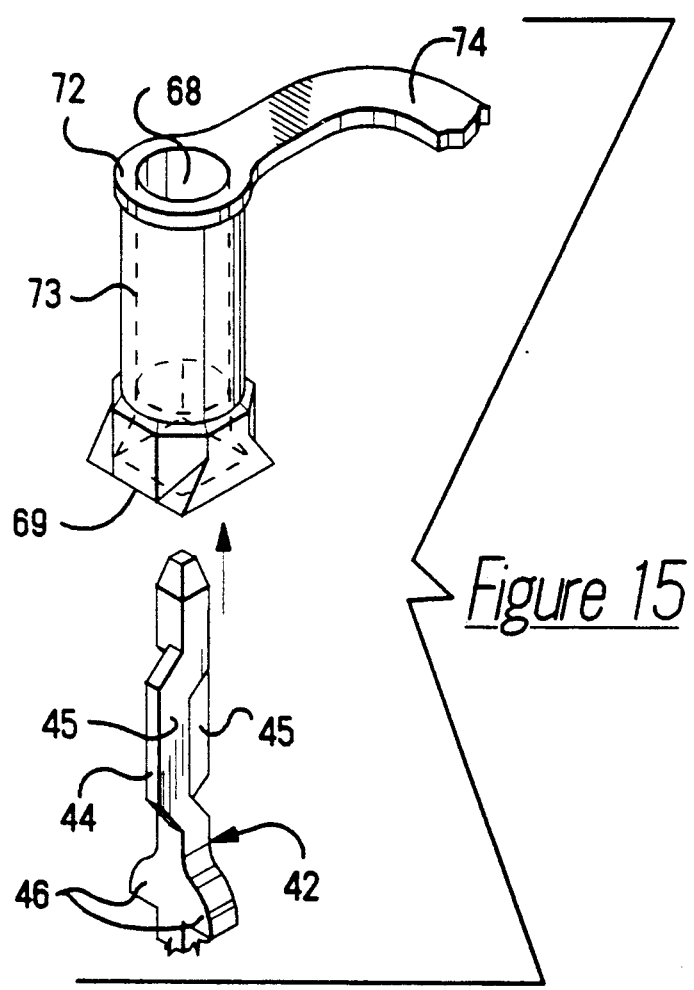

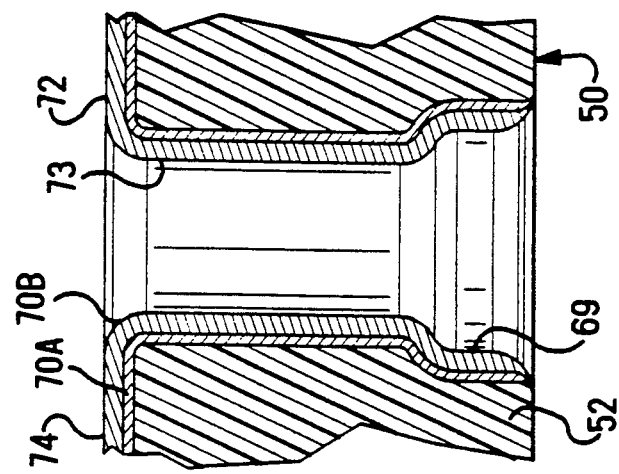
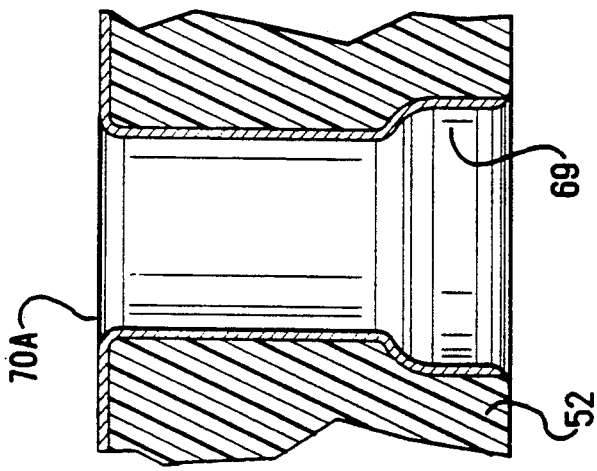
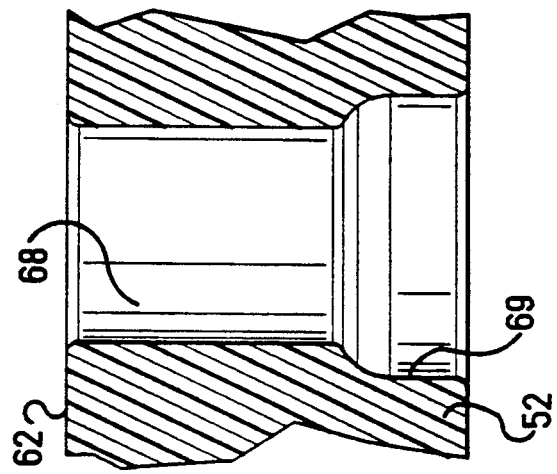

SOLDERLESS SYSTEM FOR RETENTION AND CONNECTION OF A CONTACT WITH A PLASTIC CIRCUIT ELEMENT

FIELD OF THE INVENTION

This invention relates to electrical connectors, assemblies and systems and more particularly to electrical interconnecting articles utilizing contacts having compliant spring portions within the article for electrical connection to circuits of the article as well as mechanical retention.

BACKGROUND OF THE INVENTION

Electrical connectors generally speaking have conventionally comprised housings of dielectric material, usually plastic, having passageways within which are disposed electrical contacts each extending from a first contact section exposed along one face of the housing to a second contact section exposed along another face of the housing for electrical connection with corresponding contacts of first and second electrical articles, which articles may be, for example, another connector, or a circuit board, or an electrical cable, or even an electronic component. Where the article is a circuit board, the contact sections may be pins or posts which are inserted through holes of the board which are plated with conductive material joined to circuits of the board. One type of post is adapted to be soldered within the hole or to plating material around the hole entrance.

Another type of pin or post which forms an electrical connection to a circuit of a circuit board without the need for solder, accomplishes the mechanical connection and the electrical connection by means of a compliant spring portion which is compressed upon insertion into a plated through-hole of smaller diameter. A reference may be had to U.S. Pat. No. 4,186,982 granted Feb. 5, 1980 for a teaching of one type of compliant pin construction. A pin so made and dimensioned has been formed to provide an excellent elevational interface as well as resisting axial movement and thus being self-retaining within a cylindrical hole or cavity through a strong interference fit. Such compliant spring portions of contacts are defined by integral compressible spring elements which upon insertion are compressed by the side walls of the through hole or cavity.

It has not been considered desirable to utilize an interference fit for retention of contacts in cavities of molded plastic housings, especially where the interference fit establishes a retention force of from at least eight pounds up to about twenty-five pounds such as the levels for use in defining mechanical retention and electrical connection of contacts with circuit boards. During in-service use, plastic material generally would be expected to relax under such continued interference fit, and with such relaxation of material surrounding the force fit portions of the contacts, the interference fit would be considered unreliable for assured retention. Even with compliant spring contacts, such relaxation would result in normal forces lower than those considered satisfactory for assured, continuous gas-tight electrical connection, even though the contact may continue to be mechanically retained in the hole.

With the advent of circuit elements requiring three-dimensional structure for a variety of purposes where circuits are defined on articles of plastic material molded to define the three-dimensional structure, it would be desirable to provide such articles with contacts secured thereto to facilitate interconnection with other electrical articles.

It would be further desirable to provide for securing such contacts to such articles without requiring retention clips or other such fastening devices, and to establish the continued assurance of such retention upon the contacts being subjected to stresses from the interconnection with other electrical articles.

It would be an additionally desirable to provide for electrical connection of the contacts to circuits of the article without requiring solder or additional discrete conductive elements, since soldering is not desirable with connector elements molded of platable plastic since necessary temperatures therefor are detrimental to plastic materials, and cleaning of flux following soldering subjects the plastic to intolerable chemical attack, even those certain platable plastics which are useful with high temperature applications.

Further, it would be also desirable to provide a system for retention and electrical connection of the contacts to the article irrespective of the contact having a pin contact section or a socket contact section or other type of contact section for electrical interconnection with other electrical articles.

SUMMARY OF THE INVENTION

The present invention achieves the foregoing objectives and overcomes the problems outlined in the background of the invention by the provision of a connector made to include circuit paths a portion of which consists of cavities into or through each of which is inserted a compliant spring portion of a compliant pin contact generating a spring-biased interference fit within the cavity sufficient to self-retain in the cavity, or a larger dimensioned contact portion to generate an interference fit for retention. The side wall of the cavity of an otherwise dielectric housing has conductive material thereover coated or plated in accordance with the present invention. Optionally, a second and larger contact portion is force-fit into a larger cavity portion behind the compliant spring portion to establish a supplemental retention mechanism and define an insertion depth limit, and also provide for assured axial alignment stability where the contacts will mate with corresponding contact means of a mother board connector.

In one preferred embodiment, the connector of the invention includes a housing molded of plastic engineering material of a type having characteristics suitable for plating or coating with conductive material. The connector includes rows of cavities which are plated with circuit paths extending out of such cavities across the surface of the connector to define one or more rows of contact pads. A compliant spring end portion of a contact is inserted in each cavity from the mating face and has a contact section at the other end at least exposed along the mating face of the connector adapted to mate with a respective contact means of a mating connector mounted on a first circuit board; the first circuit board may be a mother board having multiple second or daughter boards or cards mounted and connected thereto. The conductive pads are electrically engaged with respective pads of one of the daughter boards in one embodiment through a conductive elastomer or a conductive material bonding and electrically joining the connector pads to the board pads, or at least compressed therebetween to establish an electrical connection. This provision allows the connector to be mounted on a daughter card by mechanical means and electrically connected to the circuits thereof without solder, following the loading of such card with components and the soldering of such cards to interconnect the components mounted thereon.

In another embodiment of a connector utilizing the invention, the connector is given a geometry so as to incorporate transceiver chips into or onto the body of the connector with the plated or coated conductive paths leading directly to contact pins or other means of interconnecting daughter boards to mother boards through the connector.

The use of plated or coated circuit paths placed directly on the connector can reduce the R, L, and C values of the signals transmitted therealong, and can enable reduction in physical length of the circuit path and thereby the propagation delays inherent in prior art connectors having stamped and formed terminals with freestanding tails bent at right angles to be inserted in daughter card through holes. The connector, by virtue of the disposition of the conductive paths formed thereon, also can save board space and allows the positioning of transceiver chips proximate to the connector to further reduce the effects of circuit board paths, vias and relatively long lengths, turns, and transitions used in conventional board manufacturing.

Accordingly, it is an object of the present invention to provide a novel connector construction utilizing plated-through cavities and plated circuit paths, where the plated-through cavities are especially suitable for use with compliant pin contacts to establish electrical connection of the contact with a circuit of the connector as well as mechanical retention within the connector.

It is a further object to provide an interconnection assembly capable of handling fast rise time digital pulses with minimum reflection and pulse distortion.

It is another object to provide an interconnection concept, including a connector structure and board assembly which facilitates interconnection of circuit paths or digital pulses having high speed characteristics.

Embodiments of the present invention will now be described by way of example with reference to the accompanying drawings.

BRIEF DESCRIPTION OF THE DRAWINGS

FIG. 14 is a perspective showing the connector of FIG. 9 having the daughter board removed therefrom and positioned preparatory to mounting the daughter board on the connector;

FIG. 15 is a perspective showing portions of the conductive paths of the connector of FIG. 14;

FIGS. 16 to 18 illustrate the fabrication of a plated-through cavity of a molded housing by plating an initial layer and a thick subsequent layer of conductive material;

DETAILED DESCRIPTION OF THE INVENTION

Figure 1:
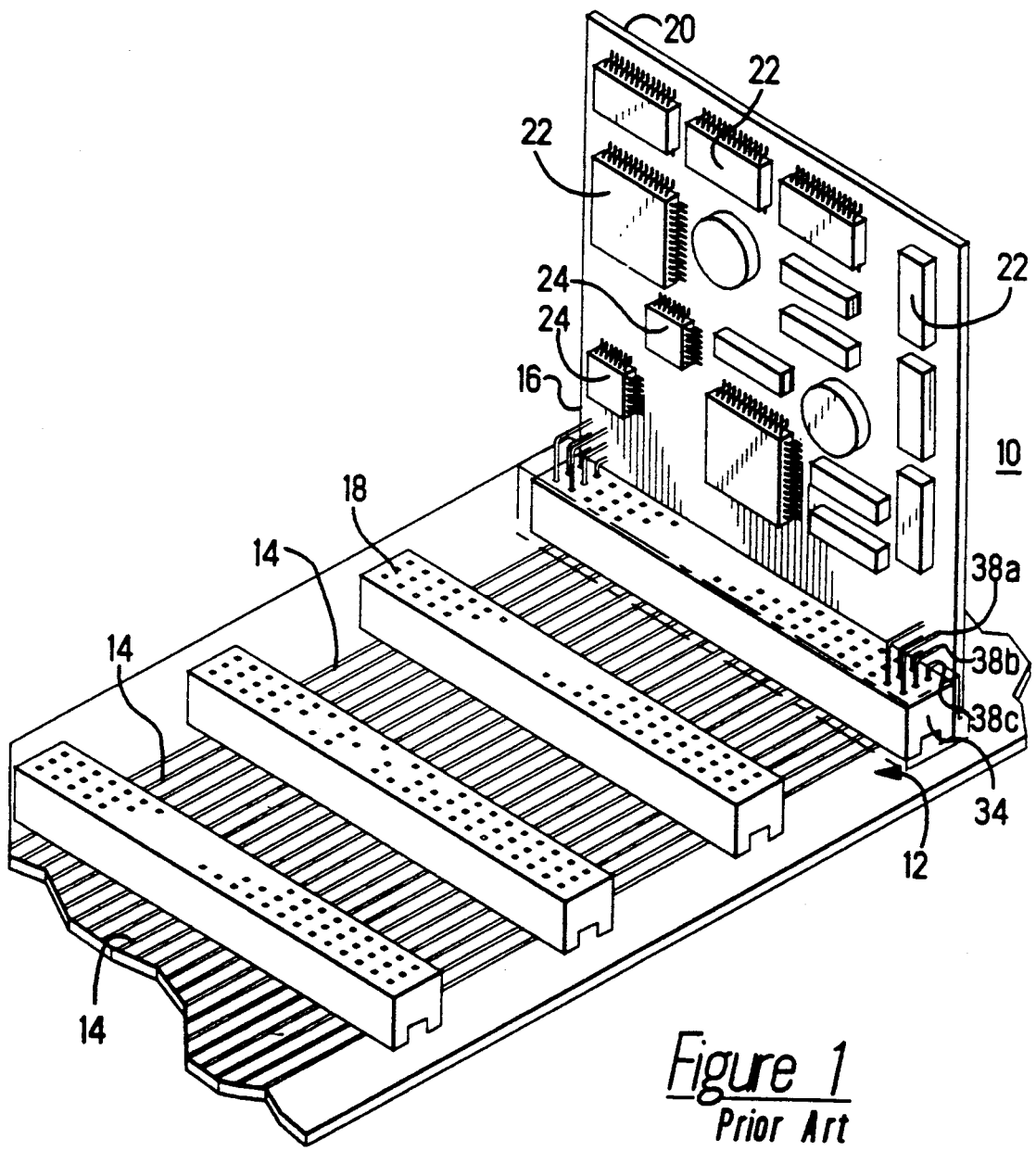
FIG. 1 is a perspective showing a conventional arrangement of daughter board, mother board, connectors and components.

In FIG. 1, an assembly 10 is shown which typifies a widespread multi-bus computer architecture. The assembly includes a mother board 12 containing therewithin multiple buses 14 which are terminated to positions along the surface of board 12 called slots or stubs 16. Each of the stubs 16 includes a connector 18 mounted on the surface of board 12, a mating connector shown as 34, and a daughter board 20 containing numerous circuits and components to perform desired functions; only one such daughter board 20 is shown.

Reference is made to a publication "Versatile Backplane Bus, ANSI/IEEE Standard 10H-1987" published by the IEEE, New York, N.Y., copyright 1988, for a description of one type of architecture under discussion, although in principle most multicard systems with backplanes are constructed similarly.

Figure 2:
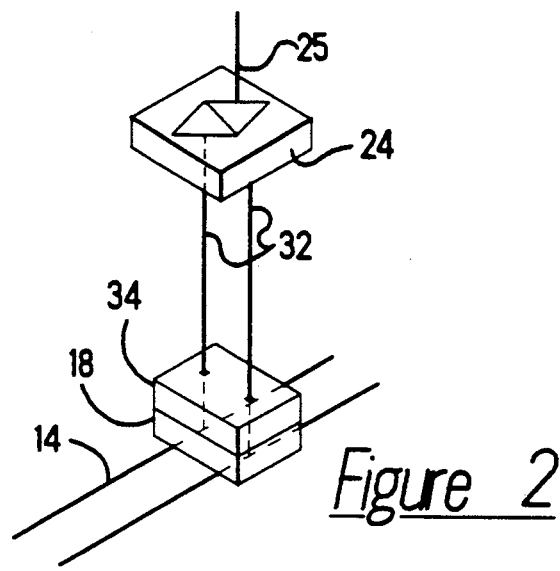
FIG. 2 is a schematic of a portion of the circuit of the arrangement in FIG. 1 shown in perspective.

Daughter board 20 includes, for example, components 22 which may represent integrated circuits performing logic or memory functions, as well as many other components including transceiver chips 24 which receive and transmit signals passed through buses 14, connectors 18, connectors 34, and various conductive paths within daughter board 20. FIG. 2 represents this arrangement with bus 14 being seen as interconnected via connectors 18 and 34 to conductive paths 32 and transceiver element 24. Leads 25 from transceiver element 24 would then be interconnected to the components being driven by or driving element 24.

Figure 3:
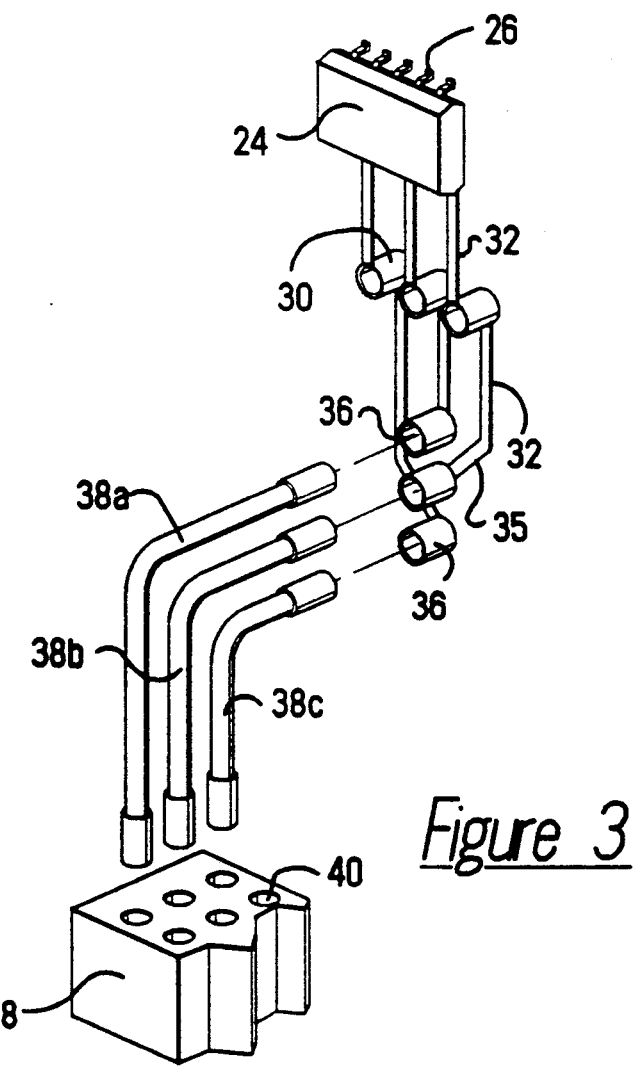
FIG. 3 is a schematic showing in perspective the conductive components forming a typical circuit path, with dielectric support material removed for clarity.
Figure 4:
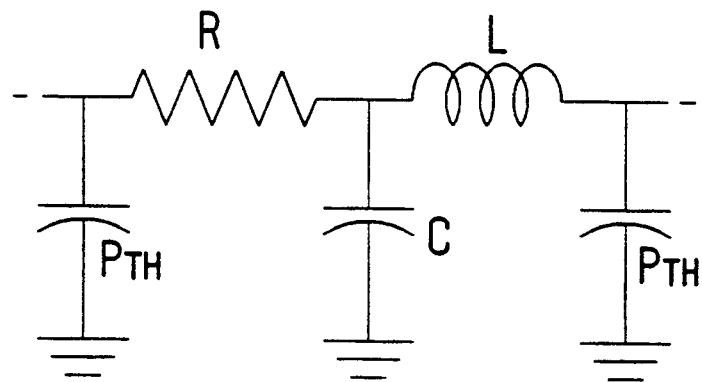
FIG. 4 is a schematic diagram of R, L, and C representing these parameters relative to the arrangement shown in FIG. 1.
Figure 5:
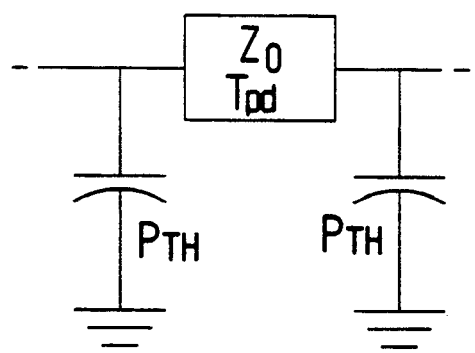
FIG. 5 is a schematic showing the Z of the circuit in relation to capacitances formed by plated-through holes ($P_{th}$)

FIG. 3 represents the physical conductive paths forming the circuit shown in FIG. 2, and FIGS. 4 and 5 represent the electrical schematic diagrams for such circuits. It is important to realize that each of the components forming the conductive paths makes a contribution to the overall circuit "seen" by signals passing to and from bus 14, connectors 18 and 34, the various leads therefrom, and the traces from within daughter board 20. Thus, for example, referring to FIG. 3, daughter board 20 includes transceiver chip 24 having leads 25 which plug into and are soldered to or otherwise interconnected to plated-through holes 30 which are electrically connected to conductive paths 32 formed within daughter board 20, within laminated dielectric layers. Paths 32 extend through various bends such as at 35 to join further plated-through holes 36 in a pattern, typically in a row to be interconnected to the contacts of connector 34, three of which are shown as 38a,38b,38c in FIGS. 1 and 3. These contacts include bends as indicated and terminate in pin portions which plug into receptacle contacts 40 within connectors 18. Receptacle contacts 40 are in turn interconnected to the conductive paths of buses 14.

A signal passing along a bus 14 "sees" all of these various elements in terms of R, L, and C, the capacitance of the plated-through holes being represented in FIGS. 4 and 5 as $P_{th}$. The signals on buses 14 thus experience a combination of these parameters forming a characteristic impedance $Z_0$ which effects the propagation delays $T_{pd}$ of the signals passing through the various conductive paths and plated-through holes to reach transceiver chip 24.

Figure 6:
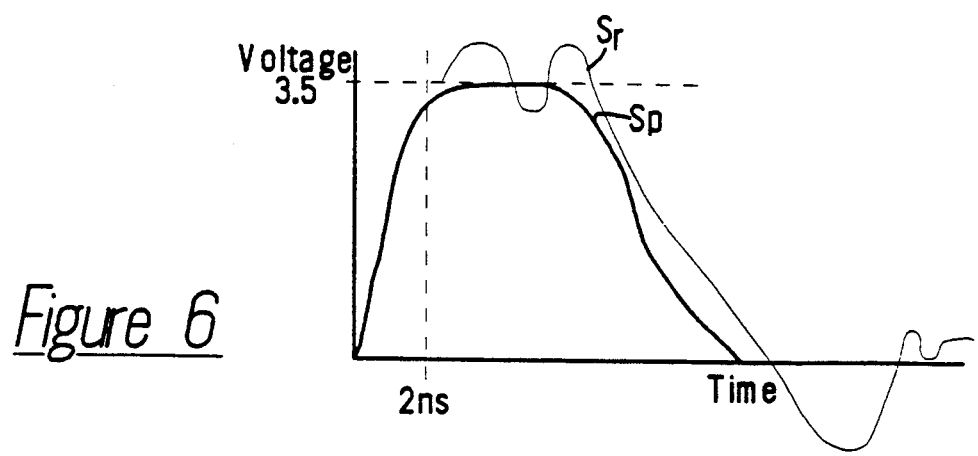
FIG. 6 is a voltage/time plot evidencing an idealized signal pulse trace and also a more typical signal pulse resulting from R, L, and C parameters.

FIG. 6 shows solidly as at $S_p$ a high rise time signal pulse, the rise time being shown as 2 nS which is idealized in terms of characteristic shape; i.e., the pulse appears as it was generated. Also shown is a pulse $S_r$ which represents what in fact may happen to the idealized shape as it passes through the various conductive paths and is exposed to the various R, L, and C parameters. As can be seen, there is a certain ringing that occurs in the form of overshoot at the top of the pulse and a further ringing that occurs which is termed undershoot at the tail end of the pulse.

Figure 7:
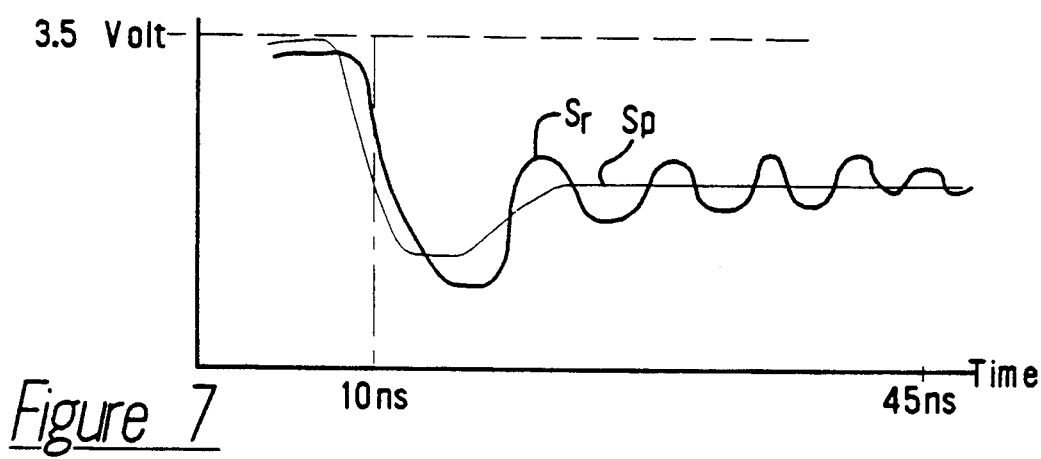
FIG. 7 is a voltage/time plot showing signal transition from high to low, idealized and typical.
Figure 8:
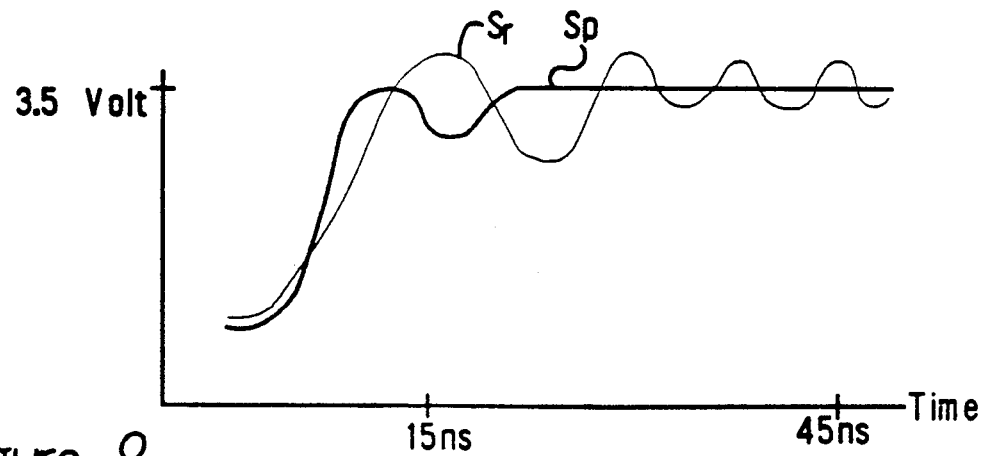
FIG. 8 is a voltage/time plot showing a voltage transition from low to high, idealized and typical of actual practice.

FIG. 7 shows a voltage transition, idealized as at $S_p$ or typical as at $S_r$ for a voltage transition from high to low. FIG. 8 shows similar curves in a transition from low to high. To be noted in FIGS. 7 and 8 are the transition times which are, respectively, on the order of 10 nS and 15 nS and the times taken to reach stability which are on the order of 45 nS in the Figures.

The purpose of transceiver chip 24 is to isolate or deload buses 14 from the stubs formed by daughter boards 20 and the various circuit components thereon as well as the circuits therein. It does this by isolating the effects of impedance on the circuits connected to the chip. As can be discerned from FIG. 3, the conductive paths and plated-through holes between chip 24 and buses 14 thus become even more important as variables affecting signal transmission to and from buses 14 by causing the effects shown in FIGS. 6 to 8. The degree to which transmission transitions from high to low and low to high can be made as well as the length of time the signal takes to become stable all dictate how fast a given architecture can be driven and how fast in turn it can drive the buses 14 and perform the various functions.

Another aspect of this problem is now appreciated in that in typical practice, boards 20 are laid out and provided with components to perform certain circuit functions with the various chips and logic and memory devices typically being different and differently positioned on the boards, along with the various transceiver chips. In times past with pulse rise times on the order of milliseconds, the prior art practice of positioning components and board layout was less critical. With high rise time pulses like that shown in FIG. 6, the layout becomes very critical.

In U.S. Pat. No. 4,583,807 granted Apr. 22, 1986, a daughter board connector is shown wherein the contact elements for a surface-mounted right angle connector, those equivalent to the contact elements 38a,38b,38c shown in FIG. 1 and in FIG. 3 are each given different thicknesses in an attempt to hold the resistances of the conductive paths of the several rows of contacts to be identical.

U.S. Pat. No. 4,676,565 granted Jun. 30, 1987 shows a connector for a similar use with respect to a daughter board wherein the connector contacts have tails or bends comparable to those shown in the previously mentioned patent, the equivalent represented by elements 38a,38b,38c in FIGS. 1 and 3, with bends to place the contacts close to the rear face of the connector housing. One advantage of this is taught as being the reduction of the shadow or footprint of the connector upon the printed circuit board reducing the amount of space occupied by the connector.

Both of the foregoing prior art patents mention relatively high numbers of contacts for such connectors as for example ninety-six contacts in three rows which must be employed to accommodate circuit boards. Both also evidence the need for attention on the one hand to electrical parameters and on the other hand to space saving features in connectors.

Figure 9:
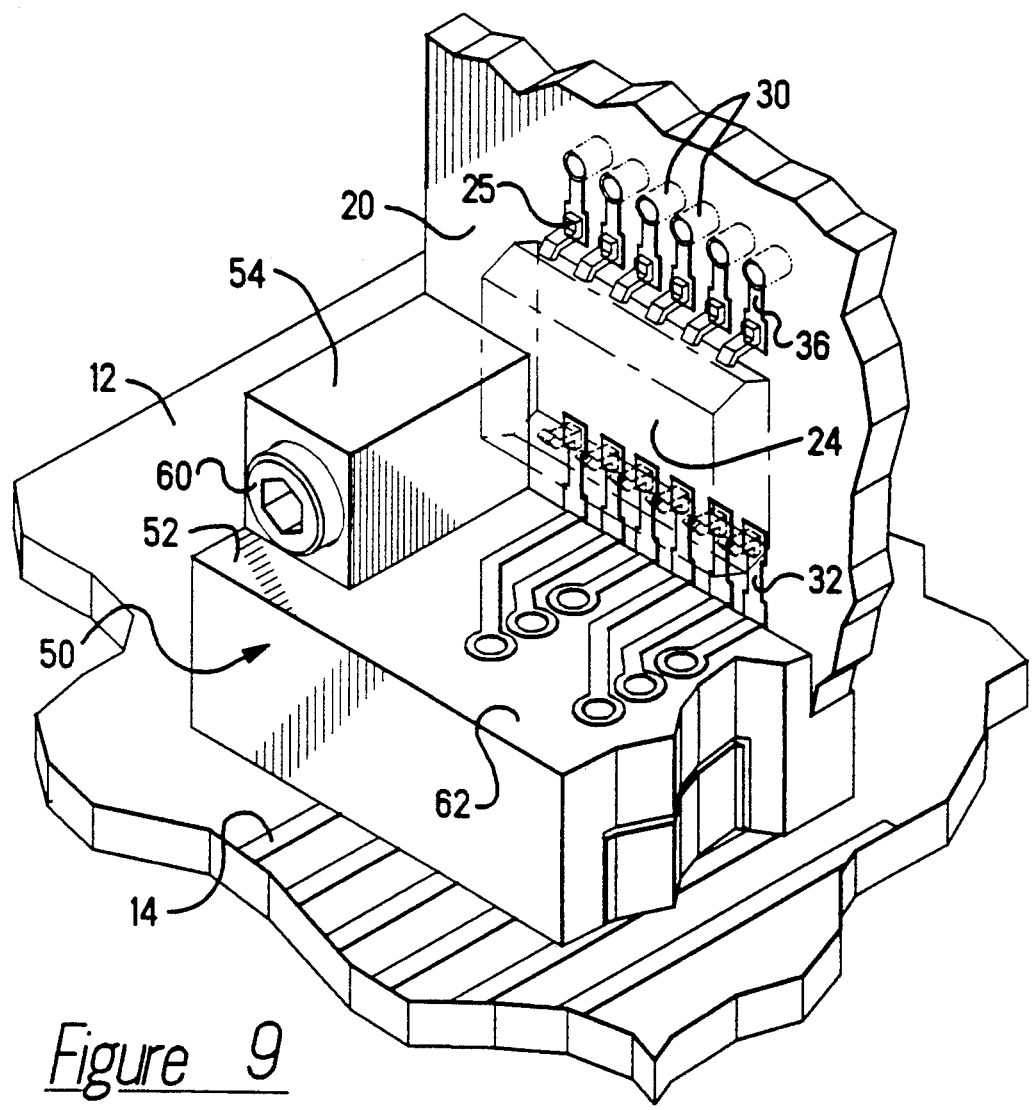
FIG. 9 is a perspective showing in part a mother and daughter board interconnected by a connector embodying details of the invention.
Figure 10:
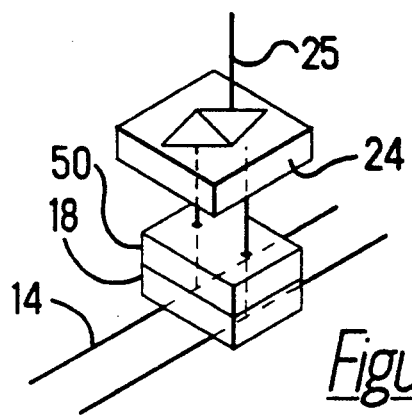
FIG. 10 is a schematic representing the circuit manifest in the arrangement in FIG. 9.
Figure 11:
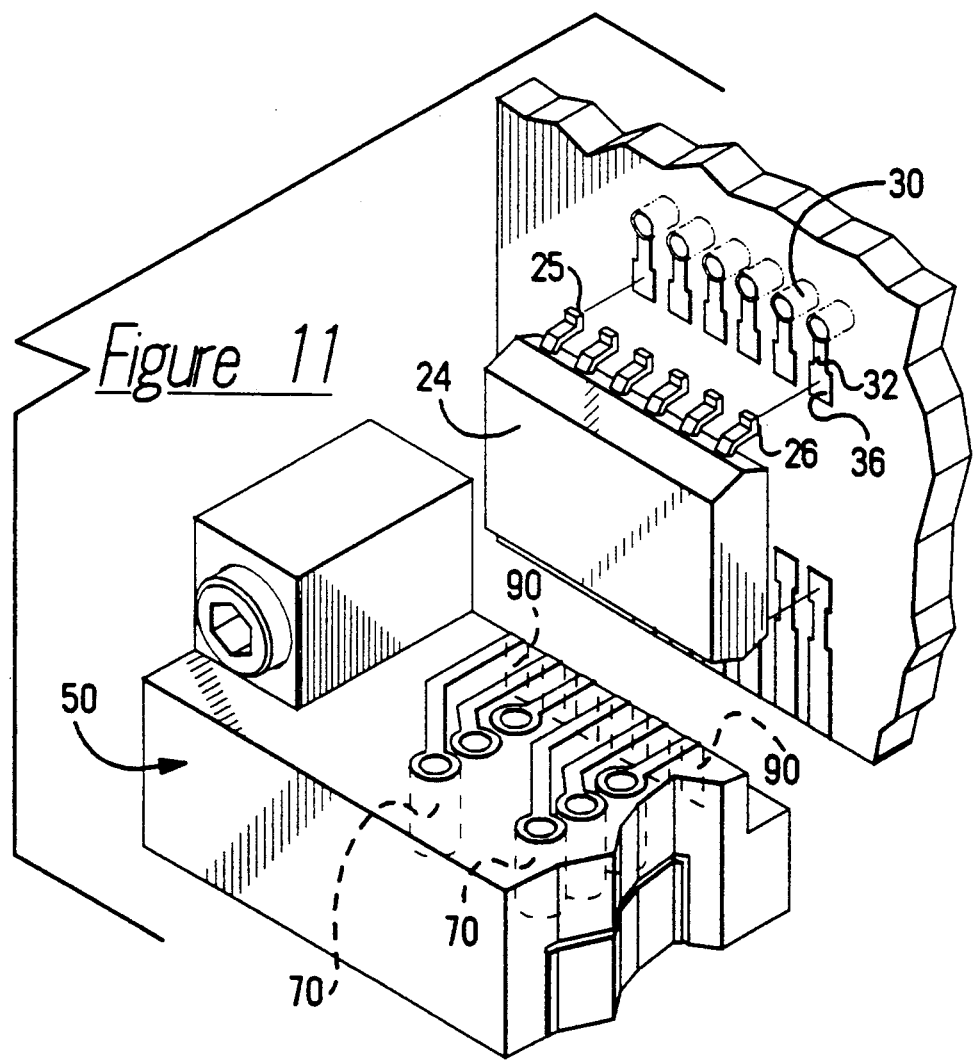
FIG. 11 is a perspective and schematic showing the conductive traces with insulating and supporting material removed from the components forming the circuit in the arrangement of FIG. 9.

FIG. 9 shows an arrangement which can be visualized in the context of FIG. 1 in relation to mother board 12, buses 14, connector 18 and a daughter board 20. A connector 50 is shown which is described in U.S. patent application Ser. No. 07/704,519 filed May 23, 1991 and assigned to the assignee hereof. As can be discerned, connector 50 is of a different geometry from that of connector 34 shown in FIG. 1, a geometry including the conductive paths and contacts, facilitating a movement of transceiver chip 24 downward on board 20 and very close to the connector. As a result of this, and as shown in FIGS. 10 and 11, the transmission line aspects of the various conductive paths heretofore depicted in FIGS. 2 and 3 are greatly shortened for improved performance with respect to signal transmission.

Additionally, connector 50 has a housing 52 formed of a plastic material of a type readily plated with the plating forming conductive paths bound to the surfaces of the housing rather than separately formed and fastened thereto as in the patents heretofore mentioned. The plastic material may be any one of a number of thermoplastic materials having surface characteristics facilitating plating thereon.

Figure 12:
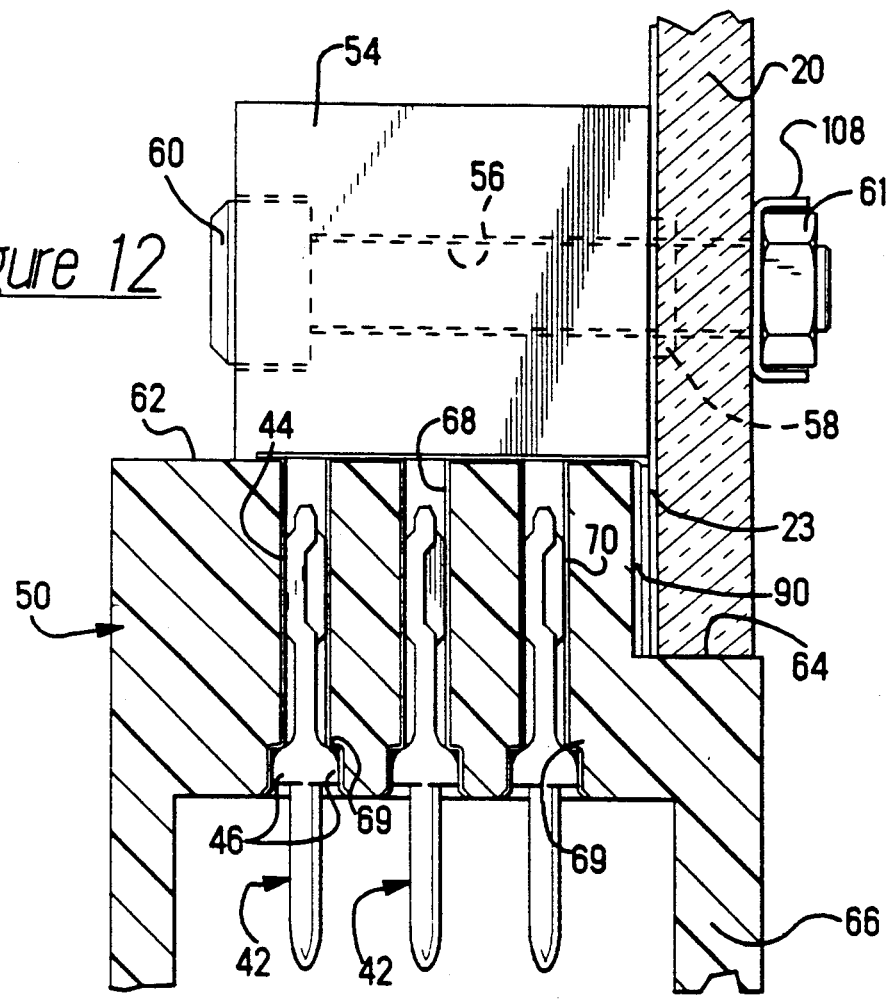
FIG. 12 is a section, in elevation, of a portion of the connector shown in FIG. 9.

Housing 52 of connector 50 includes at each end, one end being shown in FIG. 9, a mounting flange 54 apertured as shown in FIG. 12 to include a cavity 56 carrying a fastener 60, a bolt in this embodiment, extending through cavity 56 to lock connector 50 to daughter board 20. As shown in FIG. 12, a nut 61 attaches to bolt 60 for this purpose. As shown in FIG. 14, mounting flange 54 further includes a small circular projection 58 which cooperates with an aperture 21 in daughter board 20 to align and position the board relative to the connector, thus registering the array of pads 92,93,94 with the respective array of pads 36 of daughter board 20.

As can be seen in FIG. 9 and in FIG. 12, housing 52 includes an upper surface 62 which leads to a step and a further surface 64 accommodating the butt end of board 20. The housing also includes shroud 66 in the manner shown in FIG. 12 which defines a cavity and surrounds pin portions of contacts 42 extending outwardly from their respective cavities to engage the contacts as previously mentioned in connector 18, and also surrounds, aligns, and guides connector 50 relative to engagement with the outer walls of connector 18 mounted on board 12 in FIG. 1 during mating therewith. Contacts 42 extend within further cavities 68 in the body of housing 52 leading to surface 62 on the upper face of the housing.

As can be seen in FIG. 14, a number of rows of cavities 68 are provided, three being shown, with each of the rows including cavities containing conductive paths such as 76 and 80 extending out onto the surface 62. Path 76 continues as at 78 and path 80 continues as at 82 to join a series of pads in a single row on a step surface of housing 52. The pads are shown as 90,92,93,94 and are made to be on centers corresponding to conductive paths 32 in board 20 which, in the embodiment shown in FIG. 14, conclude in pads 36 on the surface of daughter board 20.

Cavities 68 are, in accordance with the invention, made to contain a coating such as a plating 70 which extends upwardly of cavity 68 and out onto surface 62. FIG. 15 shows the coating leading to a portion 72 which extends along the surface of 62 in the manner shown as 74; coating 70 also includes a tubular geometry shown as barrel 73. FIG. 15 also illustrates a contact 42 having a compliant spring portion 44 similar to that disclosed in U.S. Pat. No. 4,186,982, and a corresponding representative plated through cavity 73 of a dielectric structure as used in one embodiment of the present invention which extends to a far surface thereof upon which is disposed a conductive trace or path 74 terminating at annular pad 72 surrounding the entrance to through-cavity 73 and integrally joined to the coating or plating 70 of the inside wall surfaces of the surrounding hole through the dielectric material, with the coating 70 thus defining barrel 73. Compliant spring portion 44 is dimensioned relative to the interior diameter of 73 to fit therewithin and provide a stable low-resistance interface therewith. Compliant spring portion 44 can be seen to extend for a short axial distance between a solid intermediate portion of the contact and a solid end of the contact 42, both of which are noncompliant. An enlarged portion of contact 42 such as laterally extending tabs 46 can engage for example a stop surface defined by an enlarged hole entrance 69 of the cavity to stop axial movement of contact 42 upon reaching the desired depth of contact insertion thereinto.

The various conductive paths, including barrel 73 and paths 74, 78, and 82 as well as pads 92,93,94 are all formed by first applying a catalyst to such areas, electrolessly plating such areas and then building up the conductive bulk by electroplating or electroless plating. This may be done in a number of ways ranging from printing, silk screening, or utilizing a masking technique which activates selectively a coating on the housing only where plating is desired. Reference is made to U.S. Pat. No. 3,745,045 granted Jul. 10, 1973 for a teaching of a method of selectively applying conductive material into cavities and onto the surfaces of dielectric medium utilizing an ink containing a plating catalyst. U.S. Pat. No. 4,872,844 discloses plating traces on selected surface portions and within cavities of a molded plastic adapter substrate. U.S. Pat. Nos. 3,629,185; 4,511,597; 4,532,152; and 4,604,799 disclose techniques for plating of traces on dielectric surfaces, including using electroless or electroplating techniques, or a combination thereof.

The various paths may be shaped with respect to thickness and height to provide a balance of R as between the different paths. Thus, the path defined by 82 can be made thinner or less wide than path 92, which in turn can be made restricted relative to path 90 so that the resistance of the three paths is essentially identical. With the arrangement shown and just described, the conductive paths will have been shortened considerably and meaningfully relative to that of the paths shown in FIGS. 1 to 3. The spacing between the paths can be controlled to reduce C as much as possible with the bends both in the plane of 62 and around the corner to the step are radiused to minimize L. In this regard, electropolishing of the conductive path edges to preclude points and sharp radiuses can also be employed to minimize not only quantitative values of C and R, but field fringing effects and the like.

Tape 100 is shown in FIG. 14 is provided which is comprised of two peelable tapes 102 and 104, one of the tapes 102 carrying a series of pads 106 of conductive material. Pads 106 are made to be on centers corresponding to pads 36 on board 20 and pads 90,92,93,94 on connector 50. In practice, tape 104 is removed with tape 102 pressed against the surface of board 20 and conductive pads 106 bonded to pads 36. Thereafter, tape 102 may be peeled off, removed, and board 20 applied to connector 50, projection 58 entering aperture 21 to align the two elements together and the board pressed against the connector and held thereto by bolt 60 and nut 62 in the manner shown in FIG. 12. Such tape can be of the anisotropic kind disclosed in U.S. Pat. No. 4,588,456 made to be 5 mils thick.

Figure 13:
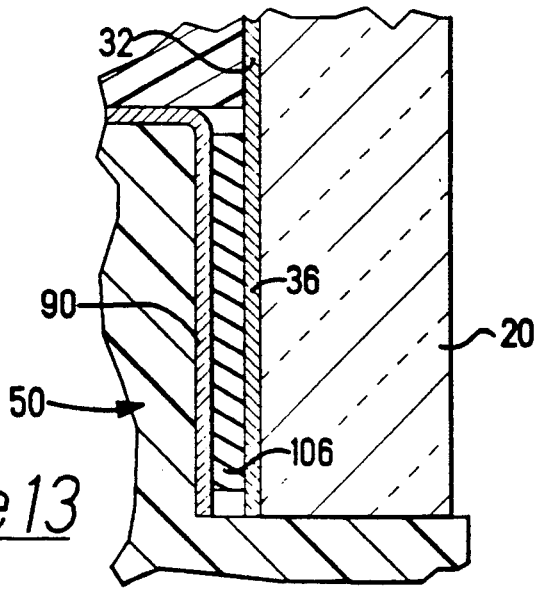
FIG. 13 is an enlarged sectional and elevational view of the detail of the connector shown in FIG. 12.

Conductive pads 106 may be, in one embodiment, formed of a conductive elastomer of a type wherein a dielectric and resilient material is loaded with conductive particles such as silver platelets, silver balls, or particles or silver plated resilient particles or silver plated nickel particles which, under the pressure driving pads 36 against the pads 90,92,93,94, are brought into engagement to provide a low-resistance, stable interface. Conductive adhesive may also be used wherein a one or two part adhesive system is loaded with conductive particles which are forced together under pressure to provide a conductive paths which is more permanent than that of the elastomer. FIG. 13 shows the latter with the material of pads 106 joining pads 36 and 90 electrically. The invention contemplates that pads 106 are substrate-like conductive material, coated or bonded, resilient or rigid, sufficiently thin to minimize resistance and interconnect the elements. A single layer of anisotropic conductive material may be used coating the various pads 92,93,94 in lieu of separate pads 106 to effect interconnection of the elements; discrete deposits of conductive gel of certain height can also be formed and cured on pads 90,92,93,94 which will be compressed between the pads and pads 36 of daughter board 20, if desired.

Figure 19:
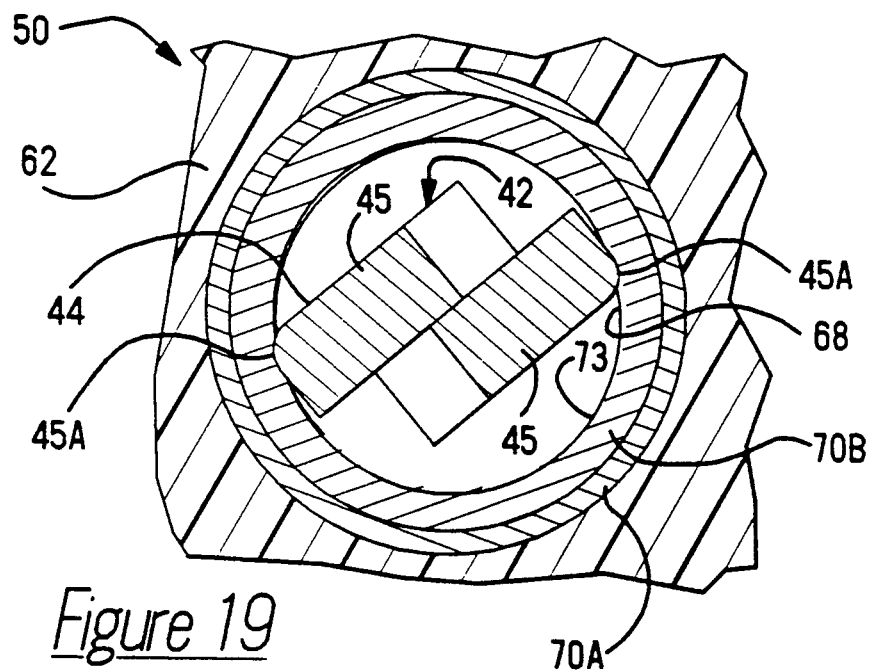
FIG. 19 is an enlarged cross-section of a plated-through cavity after a compliant spring section has been force fit thereinto for retention and electrical connection to the conductive plating material.

With respect to the use of plated-through holes in conjunction with the compliant pin as heretofore described, and in accordance with the present invention, it has now been discovered that a compliant pin may be made to work in plastic housings of a type readily molded to have characteristics allowing the plating thereon if the plating layer along the side walls of the plated-through cavity is sufficiently thick. Preferred plastics are selected for minimal resilience and high stress modulus, and also for dimensional stability after molding. For example, the thickness of plating, which may be comprised of copper or electroless nickel to form the thickness of the plating 73 shown in FIGS. 15, 18 and 19 is on the order of about 0.0014 inches. Thicknesses which are the equivalent of one ounce copper which are formed to create the conductive paths on the surfaces of the connector and the pads thereon, may be employed to plate the cavity side walls as well.

A reference may be had to U.S. Pat. No. 4,186,982 granted Feb. 5, 1980 for a teaching of a compliant pin construction. A pin so made and dimensioned has been formed to provide an excellent elevational interface as well as resisting axial movement. Examples of such split beam compliant pins are sold by AMP Incorporated of Harrisburg, Pa. under the trademark ACTION PIN contacts such as Part Nos. 2-532420-0 (0.025 inch square posts) and 534503-8 (0.015 inch square posts) recommended for use with printed circuit boards of conventional epoxy-fiberglass construction having through-holes drilled therethrough which are then copper plated and tin-lead overplated and have nominal plated diameters of 0.040 inches (but commonly ranging from 0.037 to 0.043 inches) and 0.024 inches (from 0.022 to 0.026 inches) respectively, and after insertion of the compliant spring section into such a hole with a forty pound force (maximum) the designed retention force range is from at least eight pounds to about twenty-five pounds. The present invention may also be used with compliant pins of other conventional compliant spring construction which achieve an interference fit of similar retention force levels.

For use with the present invention, it is preferred that for contacts 42 matable with socket contacts of a connector 18, a pair of tabs 46 be formed on each contact to define an enlarged contact portion to be inserted into an enlarged cavity entrance 69 in a substantial interference fit of about two to five pounds until seated against the stop shoulder defined by the smaller diameter of cavity 68, which establishes not only additional resistance to pull-out but also stable axial alignment of contact 42 in passageway 68 since contact 42 will be subjected to stresses during mating with and unmating from contacts of mother board connector 18.

One example of a connector for use with compliant pins 42 is fabricated as indicated in FIGS. 16 to 18: a housing 52 is molded of a resin having low resilience and dimensional stability after molding. Such resins include VECTRA C810 liquid crystal polymer (trademark of Hoechst-Celanese Corporation); VICTREX amorphous polyethersulfone (trademark of ICI Americas Corporation); and ULTEM amorphous thermoplastic polyetherimide (trademark of General Electric Company). Molded housing 52 has cavities 68 of un-plated diameters of about 0.044 to 0.048 inches; a first layer 70A of conductive material such as copper is electrolessly plated onto all exposed surfaces of connector housing 52 including the side walls of cavities 68,69 to a thickness of about 50 microinches after which a plating resist mask is adhered onto the portions of the outer surfaces which are not to be circuits; and a second layer 70B of conductive material such as copper is then electroplated onto exposed surfaces of first layer 70A to a thickness of about 0.0014 inches after which the plating resist and the underlying portions of the first layer are removed chemically and the circuits remaining preferably being overplated with gold over nickel, with all of the steps generally being by conventional techniques. As a result the inside diameter of each cavity 68 is about 0.041 to 0.045 inches. A split-beam compliant pin 42 as disclosed in U.S. Pat. No. 4,186,982, is defined by a beam split into at least two coextending legs compressible at least alongside each other upon insertion into a respective cavity, and is made of phosphor bronze gold plated with nickel underplating with a post section 0.025 inches on a side, to have a largest diagonal of about 0.050 inches prior to compression at the spring portion, and a nominal pull-out force of up to about eight to twelve pounds upon insertion into a hole of 0.040 inches nominal inside diameter such as a circuit board through-hole.

An alternate method would be to provide a housing having an ultraviolet sensitive catalyst in the plastic, providing a UV-opaque mask over the noncircuit surface portions of the housing surface, illuminating the housing with ultraviolet light and activating the catalyst in the unmasked regions, cultivating metal ion growth in the unmasked regions, electrolessly plating a thin first layer of copper to the metal ions, and electrolessly plating a thick second layer of copper thereover, defining the circuits.

In the present example such a pin after insertion into the plated cavity of the plastic housing, would have a nominal pull-out force of about 3.5 pounds resulting from the compliant spring compression; an acceptable range of pull-out forces would be from about two pounds up to about seven pounds, by varying incrementally the plated diameter of the cavity 68. An additional pull-out force of from two to five pounds would result from the force-fit of shoulder 46 within enlarged cavity entrance 69; together the pull-out force of the entire contact within the cavity would be from about four pounds to about nine pounds. The diameter of the cavity of a housing of a particular plastic material would vary incrementally depending upon the type of plastic material being used, and this could be determined through routine testing; additional compensation could be attained by slightly varying the thickness of the plating material.

For example, using VICTREX amorphous polyethersulfone resin, the unplated hole diameter could be about 0.047 inches, with 50 microinches of electroless copper and 0.0014 inches of electrolessly plated copper thereover, resulting in a plated hole diameter of about 0.044 inches. Or, using VECTRA liquid crystal polymer, the unplated hole diameter could be about 0.046 inches and the plated diameter, 0.043 inches. Also if desired the design of the compliant pin contact could be varied slightly in shape, in dimension or in choice of metal to assist in achieving an optimum mechanical retention of contact in housing balanced with optimum electrical connection with the plating material able to be achieved without forming microcracks in the plating material.

With reference to FIG. 19, the plating material 70 comprising one ounce copper defines a barrel having a strong hoop strength to compress the stiff spring of the compliant pin upon insertion without being substantially deflected or deformed radially outwardly, and has been found not to exhibit microcracks which would conventionally be expected of plating over plastic structure because of the low resilience and high stress modulus and dimensional stability after molding, of the supporting plastic undersurface which is smooth from the molding process, when subjected to such a severe interference fit concentrated at two opposed radial locations 45A by the two legs 45 of split-beam spring portion 44 of pin 42.

With respect to the embodiment of the invention shown in FIG. 15, the forming of the conductive paths is contemplated as being formed by either additive or subtractive electrochemical processes meaning that the paths may be formed simultaneously for a given connector or in fact for many connectors or etched films to very tight tolerances, formed by processes by the same type utilized to form the printed circuit boards with which the connectors are used. The various geometries possible utilizing the concepts of the invention heretofore described will substantially reduce the R, L, and C, and also the propagation delays associated with signal transmission and yet be fully compatible with existing geometries of mother and daughter boards and widely used bus architecture, the essential change required only relating to the provision of pads 36 which are frequently found in any event on daughter boards and the substitution of the connector geometry shown along with the use of conductive elastomers or conductive adhesives. The improvements in performance should suffice for many applications, particularly where pulse rise times are on the order of more than 2 nanoseconds. For applications wherein the pulse rise times are on the order of 2 nanoseconds, or even slightly less, the invention contemplates yet another embodiment, the embodiment shown in FIGS. 20 to 22 which is adapted to incorporate transceiver chips or other active devices to electrically interconnect and simultaneously modify circuits of two circuit boards. Such an embodiment is described in U.S. Pat. No. 5,118,300. With respect to FIG. 20, mother board 12, buses 14, connector 18 and daughter board 20 can be discerned in relation to a connector 110 which is formed of a plastic material suitable for plating or printing upon to form conductive paths thereon.

Connector 110 has a housing 112 with an upstanding portion 114 joining a transverse portion 116 and lower projecting portions 118 and 120. Portions 118,120 define a shroud surrounding pin portions extending outwardly from their respective cavities 140 and also surround, align, and guide connector 110 relative to engagement with the outer walls of connector 18 mounted on board 12 in FIG. 1 during mating therewith. On the upper surface of the connector housing are surfaces 122 and 124 which lead to interior surfaces 126 and 128. Rows of pads such as 130 are formed on surfaces 122 and 124 and joined by conductive paths such as 132 which extend on surfaces 126 and 128 to join annular pads 138 leading to conductive material on the surfaces of cavities containing spring portions 44 of contacts 42, shown as 142 in FIG. 22; compliant spring portions 44 engage the coating in the cavity establishing both a retentive interference fit and an assured electrical connection. As an additional feature, the various paths on surfaces 126 and 128 may be made to include jumper or bypass paths 144 which carry common circuits from one surface to the other and therefore from the mother board to the daughter board in terms of circuits. These are typically utilized for extending ground and power through the connector.

Figure 20:
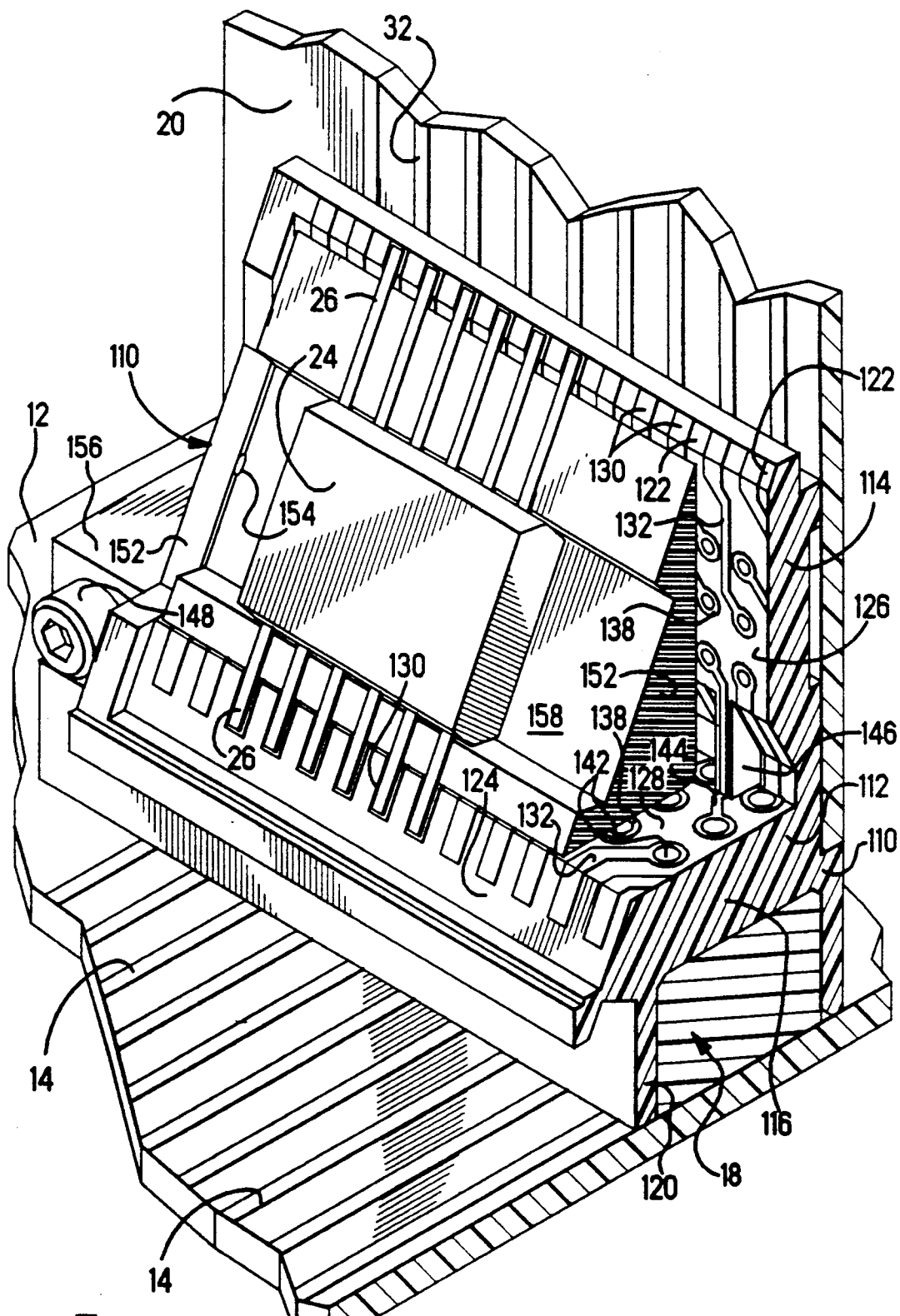
FIG. 20 is a perspective showing parts of an alternative embodiment of the connector of the invention incorporating an integrated circuit therein.
Figure 22:
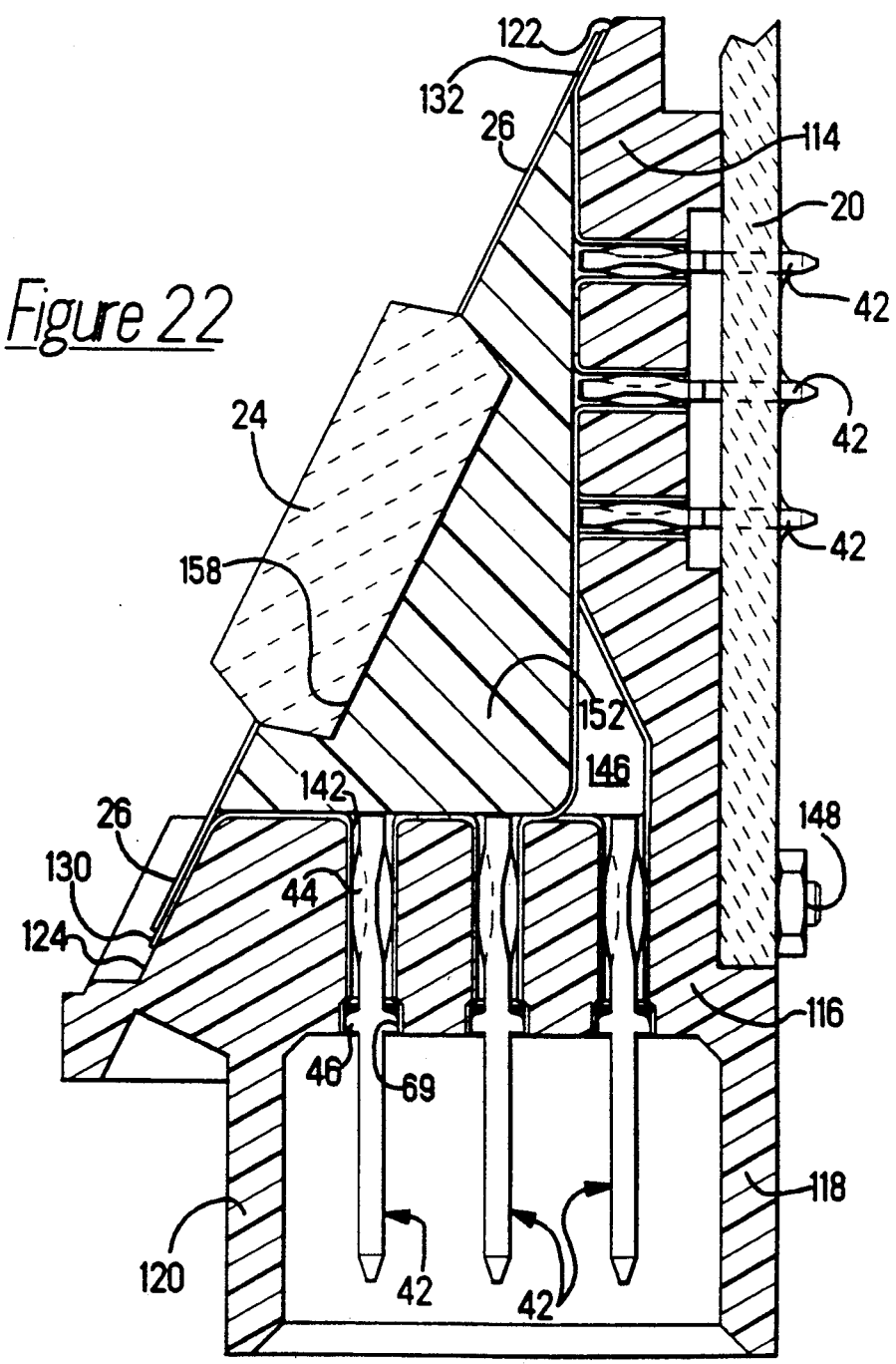
FIG. 22 is a sectional view of the connector shown in FIG. 20.

Housing 112 of FIGS. 20 and 22 preferably includes a series of reinforcing ribs 146 spaced along the right angle inside corner joining the vertical and horizontal portions 114,116. The outwardly facing edge surface of each rib 146 can preferably have certain ones of jumper or bypass circuit paths 144 defined thereon enabling higher density path definition. Housing 112 is preferably secured to daughter board 20 by bolt fasteners 148 inserted through apertured flanges 150 at each connector end onto which are threaded nuts. For a pin with a square post dimensioned 0.015 inches on a side and not having a second force-fit section, such as would be used with daughter board 20, an unplated hole diameter of about 0.0275 inches and a plated hole diameter of about 0.0245 inches would be preferred, with a resultant higher pull-out force of about 4 to 4.5 pounds; such pins would be soldered in through-holes of board 20 and would not be mated and unmated with contacts of another connector during in-service use.

In the embodiment of FIGS. 20 and 22, a second dielectric portion of the connector, triangular cross-section plastic insert 152 is made to fit in and against surfaces 126 and 128 and be secured to housing 112 such as by being latched under latches 154 on end walls 156 of housing 112, and to carry on its upper surface transceiver chips or the like, such as chip 24 having leads 26 and receivable within recess 158. Insert 152 provides dielectric structure insulating exposed circuits and contact ends of housing 112, and further provides support for chip 24 during and after assembly. Surfaces 122,124 are angled with respect to adjoining surfaces 126,128 in such a manner as to substantially be coplanar traversing the right angle bend of L-shaped first connector portion 112 at edges remote from the junction of the L. Leads 26 are interconnected to pads 130 appropriately spaced along surfaces 122,124 with chip 24 optionally bonded in position to plastic insert 152 in a suitable fashion.

The interconnection of the chip leads to the pads may be done in a number of manners, depending upon the nature of the chip packaging. Thus, for example, chip 24 shown in FIG. 20 has flat tabs arrayed in a plane which may be joined by conductive adhesive or held by some suitable means, or may be welded to such paths by conventional integrated circuit tape-automated-bonding techniques; chip 24 may be assembled to connector 110 such as by automated apparatus which will weld leads 26 to contact pads 130 after registration of leads 26 therewith, remaining unattached to insert 152 at least prior to registration and welding. Alternatively, if chip 24 itself includes pads, wire bonding may be employed to join the chip to pads 130. As a result of the foregoing package detail, the transceiver chips will have been incorporated into the connector itself to thus remove the transceiver chips from daughter board 20 and result in the improvement electrically as indicated in FIG. 22 with the greatly reduced R, L, and C and propagation delay with respect to prior art structures. The invention heretofore described has emphasized a number of different embodiments with respect to plating, coating, or otherwise forming conductive paths on the surfaces of the connector housings, such paths being integrally bound to such surfaces. The invention contemplates that the various embodiments of forming conductive pads directly on the housing material may be utilized with the various embodiments incorporating transceiver chips into the connectors. Further the present invention is useful with contacts having compliant spring portions other than split beam types, and also with contacts simply having a larger dimensioned portion sufficient to generate an interference fit upon insertion into the plated cavity of the plastic housing. The contacts can also have a socket contact section instead of a pin, for mating with contacts of a mating connector.

The present invention provides a means of utilizing molded three-dimensional plastic articles as connectors and interconnectors and even essentially two-dimensional planar plastic substrates having discrete contacts assembled thereto, without using solder or other separate conductive retention parts. The present invention is especially useful in arrangements where two mating faces are not on symmetrically opposed surfaces, such as seen in FIGS. 12 and 22, or where the opposed associated contacts and contact means cannot be in alignment with each other but must be offset. Soldering is not desirable with connector elements molded of plastic since necessary temperatures therefor are detrimental to platable plastic material, and cleaning of flux following soldering subjects the plastic to intolerable chemical attack, even those certain platable plastics which are useful with high temperature applications.

A comparative analysis of VME bus performance with transceivers and connectors in accordance with the invention versus a transceiver location in a typical manner on a daughter board was performed simulating standard conductor path parameters. The load slot or stub path was chosen as a three inch length of a 75 ohm strip line with its values of R, L, and C lumped, the dip package was estimated with the plated-through hole loadings being on the order of 1 pF. The sum of values following connective paths including printed through holes along the lines shown in FIG. 3 had the following result:

R = 3.5 ohms
C = 14.7 pF
L = 46.5 nH
Z = 56 ohms
$T_{pd}$ = 731 picoseconds.

Figure 21:
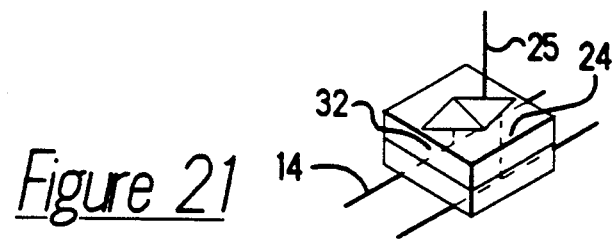
FIG. 21 is a schematic showing the electrical aspects of the circuit formed by the connector, mother board and daughter board as shown in FIG. 20.

Utilizing the invention version using the elastomeric connector has shown in FIGS. 20 to 22 wherein the connector is made to incorporate the transceiver device, the following parameters were obtained in simulation:

R = 1.3 ohms
C = 6.2 pF
L = 21.2 nH
Z = 59 ohms
$T_{pd}$ = 286 picoseconds.

As can be discerned from the foregoing, substantial reductions in R, C, and L, as well as, importantly, propagation delay as between the prior art approach and the invention approach. More importantly, the variations in paths implicit in the paths from each of the three rows were significantly reduced as well. Put another way, the path associated with the one row closest to the daughter board was made to have parameters much closer to the path associated with the row furthest away from the board; in some instances, improvements as much as 50 percent were attained in this variation of parameters, and are an important consideration for circuit and board design attributed to the connector of the invention.

Having now described the invention in terms intended to enable the preferred practice of the various embodiments thereof, claims are appended intended to define what is inventive.

What is claimed is:

1. A system for interconnecting circuits of first and second electrical articles, said system comprising:

a plastic housing of dielectric material having first and second arrays of contacts adapted to mate with corresponding contacts of corresponding said first and second electrical articles, said housing including first and second arrays of cavities for said first and second contact arrays respectively, each said cavity adapted to mechanically hold a contact in position in said housing, each said cavity having conductive means therein joining said contact and extending to define a conductive path therethrough to join further conductive means extending to a respective cavity of the other array of contacts electrically connectable to a corresponding contact means of the other of said first and second electrical articles;

said conductive material within said cavities being formed of a plating material bound to said interior surface of said cavities; and each of said contacts of said housing including a portion slightly larger in dimension than a respective said cavity and defines an interference fit upon insertion into a said cavity to provide an electrical interconnection with said plating material and said dimension is selected to provide radial forces sufficient to prevent axial pullout of said contact with respect to said housing and self-retain therewithin, all without solder.

2. The system of claim 1 wherein each said slightly larger portion of each said contact defines a compliant spring inelastically deformable upon insertion within a said cavity.

3. The system of claim 1 wherein each of said contacts includes a widened portion rearward form said slightly larger portion, and each of said cavities includes an enlarged cavity entrance portion into which said widened contact portion is receivable upon full insertion, said enlarged cavity entrance being dimensioned just smaller than said widened contact portion to generate an interference fit providing additional retention of said contact in said cavity spaced from at least the leading end of said interference fit, providing a second interference fit along a longitudinal axis of said contact and thereby stabilizing axial alignment of said contact when subjected to stress during mating and unmating.

4. The system of claim 3 wherein said widened contact portion is defined by a pair of opposed tabs.

5. A system for interconnecting circuits of first and second electrical articles, said system comprising:

a plastic housing of dielectric material having first and second arrays of contacts adapted to mate with corresponding contacts of corresponding at least one of said first and second electrical articles, said housing including first and second arrays of cavities for said first and second contact arrays, each said cavity adapted to mechanically hold a contact in position in said housing, each said cavity of a said array thereof having conductive means therein joining said contact and extending to define a conductive path therethrough to an exterior surface of said housing to join further conductive means extending to respective ones of the other said array thereof;

said conductive material within said cavities being formed of a plating material bound to said interior surface of said cavities; and each of said contacts of said housing including a compliant spring portion radially compressible upon insertion within a said cavity to provide an electrical interconnection with said plating material, and said compliant spring portion is of a dimension radially to provide radial forces sufficient to prevent axial pullout of said contact with respect to said housing and self-retain therewithin, all without solder.

6. The system of claim 5 wherein said conductive means comprises conductive material is formed of plating material bound to said exterior surfaces of said housing, defining discrete spaced apart circuit paths.

7. The system of claim 5, wherein said retention force of compression of said compliant spring portion by said plating material of said cavity side walls is from three to six pounds.

8. The system of claim 5, wherein said contacts include male contact section extending from said housing for electrical engagement with corresponding contact means of one of said first and second articles.

9. The system of claim 5 wherein said plastic material has low resilience and high stress modulus upon being molded.

10. The system of claim 9 wherein said plastic material is liquid crystal polymer resin.

11. The system of claim 9 wherein said plastic material is amorphous thermoplastic resin.

12. The system of claim 5 wherein said compliant spring portion is defined by a beam split into at least two coextending legs compressible at least alongside each other upon insertion into a respective said cavity.

13. The system of claim 5 wherein said compliant spring portion extends an axial distance between spaced noncompliant portions.

14. The system of claim 5 wherein said second array of contacts is disposed on a mating face of said housing at least offset with respect to said first array of contacts.

15. The system of claim 14 wherein said mating face is disposed in a plane not parallel to a plane containing a mating face in which are disposed said contacts.

16. A system for interconnecting circuits of first and second electrical articles, said system comprising:
a plastic housing of dielectric material having at least one array of contacts adapted to mate with corresponding contacts of a corresponding at least one of said first and second electrical articles, said housing including an array of cavities for each said second contact array, each said cavity adapted to mechanically hold a contact in position in said housing, each said cavity having conductive means therein joining said contact and extending to define a conductive path therethrough to an exterior surface of said housing to join further conductive means extending to respective ones of an array of contact means electrically connectable to a corresponding array of contact means of the other of said first and second electrical articles;
said conductive material within said cavities being formed of a plating material bound to said interior surface of said cavities;
each of said contacts of said housing including a compliant spring portion radially compressible upon insertion within a said cavity to provide an electrical interconnection with said plating material; and
each of said contacts includes a widened portion rearward from said compliant spring portion, and each of said cavities includes an enlarged cavity entrance portion into which said widened contact portion is receivable upon full insertion, said enlarged cavity entrance being dimensioned just smaller than said widened contact portion to generate an interference fit at an axial location spaced from compressed compliant spring portion,
whereby the loaded engagement between the contact and the cavity at two axially spaced locations therealong provide stability of axial alignment of said contact when subjected to stress during mating and unmating, and together the compression of the compliant spring portion and the interference fit of the widened portion are sufficient to prevent axial pullout of said contact with respect to said housing and self-retain therewithin, all without solder.

17. The system of claim 16 wherein said widened contact portion is defined by a pair of opposed tabs.

18. The system of claim 16 wherein a stop surface is defined along side walls of each said cavity located to be engaged by said widened contact portion to stop axial movement during contact insertion when said contact has been inserted into said cavity to a desired depth.

19. The system of claim 16 wherein said retention force of compression of said compliant spring portion by said plating material of said cavity side walls is from three to six pounds, and said additional retention force of said interference fit of said widened contact portion in said enlarged cavity entrance is from two to five pounds.

20. The system of claim 16 wherein said contacts include male contact sections extending from said housing for electrical engagement with corresponding contact means of one of said first and second articles.

21. The system of claim 16 wherein said plastic material has low resilience and high stress modulus upon being molded.

22. The system of claim 21 wherein said plastic material is liquid crystal polymer resin.

23. The system of claim 21 wherein said plastic material is amorphous thermoplastic resin.

24. The system of claim 16 wherein said compliant spring portion is defined by a beam split into at least two coextending legs compressible at least alongside each other upon insertion into a respective said cavity.

25. The system of claim 16 wherein said compliant spring portion extends an axial distance between spaced noncompliant portions.

* * * * *